(12) United States Patent
Amarloo et al.

(10) Patent No.: US 11,469,566 B1
(45) Date of Patent: Oct. 11, 2022

(54) GENERATING ELECTROMAGNETIC RADIATION FROM A PHOTONIC CRYSTAL MASER

(71) Applicant: Quantum Valley Ideas Laboratories, Waterloo (CA)

(72) Inventors: Hadi Amarloo, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 17/667,296

(22) Filed: Feb. 8, 2022

(51) Int. Cl.
*H01S 1/06* (2006.01)
*H03L 7/26* (2006.01)
*H01S 5/11* (2021.01)

(52) U.S. Cl.
CPC .................. *H01S 1/06* (2013.01); *H01S 5/11* (2021.01); *H03L 7/26* (2013.01)

(58) Field of Classification Search
CPC ........................................................ H01S 1/06
USPC ........................................................ 331/94.1
See application file for complete search history.

(56) References Cited

U.S. PATENT DOCUMENTS

| | | | |
|---|---|---|---|
| 2,929,922 | A | 3/1960 | Schawlow et al. |
| 3,192,472 | A | 6/1965 | Bender et al. |
| 5,999,308 | A | 12/1999 | Nelson et al. |
| 6,265,945 | B1 | 7/2001 | Delaney et al. |
| 6,744,792 | B1 | 6/2004 | Tayebati |
| 6,816,112 | B1 | 11/2004 | Chethik |
| 7,323,941 | B1 | 1/2008 | Harper et al. |
| 7,821,704 | B1 | 10/2010 | Pepper et al. |
| 8,571,373 | B2 * | 10/2013 | Wang ...................... G02F 1/035 385/27 |
| 8,906,470 | B2 | 12/2014 | Overstolz et al. |
| 9,203,203 | B2 | 12/2015 | Benabid et al. |
| 10,135,544 | B1 | 11/2018 | Klee et al. |
| 10,605,840 | B1 | 3/2020 | Amarloo et al. |

(Continued)

FOREIGN PATENT DOCUMENTS

| | | |
|---|---|---|
| WO | 2022087743 | 5/2022 |
| WO | 2022087744 | 5/2022 |

OTHER PUBLICATIONS

USPTO, Ex Parte Quayle action dated Jan. 5, 2022, in U.S. Appl. No. 17/514,819, 15 pgs.

(Continued)

*Primary Examiner* — Joseph Chang
(74) *Attorney, Agent, or Firm* — Henry Patent Law Firm PLLC

(57) ABSTRACT

In a general aspect, a photonic crystal maser includes a dielectric body having an array of cavities ordered periodically to define a photonic crystal structure in the dielectric body. The dielectric body also includes a region in the array of cavities defining a defect in the photonic crystal structure. An elongated slot through the region extends from a slot opening in a surface of the dielectric body at least partially through the dielectric body. The elongated slot and the array of cavities define a waveguide of the dielectric body. The dielectric body additionally includes an input coupler aligned with an end of the elongated slot and configured to couple a reference radiofrequency (RF) electromagnetic radiation to the waveguide. The photonic crystal maser also includes a vapor or source of the vapor in the elongated slot and an optical window covering the elongated slot.

30 Claims, 5 Drawing Sheets

(56) References Cited

U.S. PATENT DOCUMENTS

| | | | |
|---|---|---|---|
| 10,859,981 | B1 | 12/2020 | Ramirez-Serrano et al. |
| 11,137,432 | B1 | 10/2021 | Amarloo et al. |
| 11,303,086 | B1 | 4/2022 | Amarloo et al. |
| 11,303,087 | B1 * | 4/2022 | Amarloo ............... H01S 3/0602 |
| 11,402,479 | B1 | 8/2022 | Pecen et al. |
| 2002/0163394 | A1 | 11/2002 | Hollberg et al. |
| 2004/0202050 | A1 | 10/2004 | Happer et al. |
| 2005/0007118 | A1 | 1/2005 | Kitching et al. |
| 2006/0147213 | A1 | 7/2006 | Rosenwald et al. |
| 2007/0228355 | A1 | 10/2007 | Singh |
| 2007/0247241 | A1 | 10/2007 | Braun et al. |
| 2009/0323732 | A1 | 12/2009 | Benabid |
| 2010/0108916 | A1 | 5/2010 | Barker et al. |
| 2011/0001063 | A1 | 1/2011 | Barker et al. |
| 2011/0097045 | A1 | 4/2011 | Benabid |
| 2011/0169405 | A1 | 7/2011 | Baik et al. |
| 2013/0037721 | A1 | 2/2013 | Ouchi |
| 2014/0248020 | A1 | 9/2014 | Fujita et al. |
| 2016/0178843 | A1 | 6/2016 | Fujita et al. |
| 2018/0069372 | A1 | 3/2018 | Maki et al. |
| 2019/0187198 | A1 | 6/2019 | Anderson et al. |
| 2020/0209656 | A1 | 7/2020 | Young et al. |
| 2021/0114926 | A1 | 4/2021 | Ramirez-Serrano et al. |
| 2021/0156898 | A1 | 5/2021 | Amarloo et al. |
| 2021/0285992 | A1 | 9/2021 | Amarloo et al. |
| 2021/0285993 | A1 | 9/2021 | Amarloo et al. |
| 2021/0286063 | A1 | 9/2021 | Amarloo et al. |
| 2021/0325516 | A1 | 10/2021 | Johnson et al. |

OTHER PUBLICATIONS

USPTO, Notice of Allowance dated Oct. 8, 2021, in U.S. Appl. No. 17/142,017, 23 pgs.

USPTO, Non-Final Office Action dated Jun. 15, 2021, in U.S. Appl. No. 17/142,017, 29 pgs.

USPTO, Notice of Allowance dated Jul. 21, 2021, in U.S. Appl. No. 17/142,012, 32 pgs.

WIPO, International Search Report and Written Opinion dated Dec. 30, 2021, in PCT/CA2021/051530, 9 pgs.

Anderson, et al., "An atomic receiver for AM and FM radio communication", arXiv:1808.08589v1, Aug. 26, 2018, 6 pgs.

Cox, et al., "Quantum-Limited Atomic Receiver in the Electrically Small Regime", arXiv:1805.09808v2, Jun. 19, 2018, 6 pgs.

Dharanipathy, "On the Investigation of Light-Matter Interactions in Slab Photonic Crystal Cavities", Thesis EPFL, Feb. 21, 2014, 186 pgs.

Dhillon, et al., "The 2017 terahertz science and technology roadmap", Journal of Physics D: Applied Physics, 2017, 19 pgs.

Dmytryszyn, et al., "Lasers for Satellite Uplinks and Downlinks", Sci 2021, Jan. 4, 2021, 20 pgs.

Fan, et al., "Atom based RF electric field sensing", Journal of Physics B: Atomic, Molecular and Optical Physics, Sep. 9, 2015, 17 pgs.

Gosele, et al., "Wafer bonding for microsystems technologies", Sensors and Actuators 74, 161-168, 1999, 8 pgs.

Gregory, et al., "TESAT Laser Communication Terminal Performance Results on 5.6 GBIT Coherent Inter Satellite and Satellite to Ground Links", Int'l Conf. on Space Optics, Oct. 4, 2010, 6 pgs.

Lugiato, et al., "Connection between microscopic and macroscopic maser theory", PhysRevA 36,2, Jul. 15, 1987, 4 pgs.

Masteika, et al., "A Review of Hydrophilic Silicon Wafer Bonding", ECS Journal of Solid State Science and Technology, 3 (4) Q42-Q54, 2014, 13 pgs.

Meyer, et al., "Digital Communication with Rydberg Atoms & Amplitude-Modulated Microwave Fields", arXiv:1803.03545v2, Oct. 29, 2018, 10 pgs.

Moi, et al., "Rydberg-atom masers. I. A theoretical and experimental study of super-radiant systems in the millimeter-wave domain", PhysRevA 27, 4, Apr. 1983, 22 pgs.

Moll, et al., "Demonstration of high-rate laser communications from fast airborne platform: flight campaign and results", Proc. of SPIE vol. 9248, 2014, 6 pgs.

Narducci, et al., "Multimode laser with an injected signal: Steady-state and linear stability analysis", Phys.Rev.A, 32, Sep. 1985, 8 pgs.

Nozaki, et al., "Photonic-crystal nano-photodetector with ultrasmall capacitance for on-chip light-to-voltage conversion without an amplifier", Optica, vol. 3, No. 5, May 5, 2016, 10 pgs.

Riesing, "Development of a Pointing, Acquisition, and Tracking System for a Nanosatellite Laser Communications Module", MIT Thesis, Sep. 2015, 127 pgs.

Schuler, et al., "Graphene Photodetector Integrated on a Photonic Crystal Defect Waveguide", ACS Photonics, Nov. 13, 2018, 6 pgs.

Scullion, et al., "Slotted Photonic Crystal Sensors", Sensors 2013, 13, 3675-3710, Mar. 15, 2013, 36 pgs.

Sedlacek, et al., "Microwave electrometry with Rydberg atoms in a vapour cell using bright atomic resonances", Nature Physics 8, Nov. 2012, 6 pgs.

Silfvast, "Laser Fundamentals, Second Edition", Cambridge University Press, 2004, 670 pgs.

Suni, et al., "Effects of Plasma Activation on Hydrophilic Bonding of Si and SiO2", Journal of the Electrochemical Society, 149 (6) G348-G351, 2002, 4 pgs.

Vuckovic, "Quantum optics and cavity QED with quantum dots in photonic crystals", Lectures given at Les Houches 101th summer school on "Quantum Optics and Nanophysics", Aug. 2013, 37 pgs.

Withayachumnankul, et al., "Integrated Silicon Photonic Crystals Toward Terahertz Communications", Advanced Optical Materials 6.16, 2018, 7 pgs.

Ziegler, "A Jam-Resistant CubeSat Communications Architecture", MIT Thesis, Jun. 2017, 140 pgs.

Abari, et al., "Millimeter Wave Communications: From Point-to-Point Links to Agile Network Connections", Nov. 2016, 7 pgs.

Burnside, et al., "Design of an inertially stabilized telescope for the LLCD", SPIE LASE 2011, 2011, 9 pgs.

Holloway, et al., "Detecting and Receiving Phase Modulated Signals with a Rydberg Atom-Based Mixer", arXiv:1903.10644v1, Mar. 26, 2019, 5 pgs.

Sargent III, et al., "Laser Physics", Optical Sciences Center, Univ. of Arizona, 1974, 457 pgs.

USPTO, Notice of Allowance dated Feb. 11, 2022, in U.S. Appl. No. 17/514,819, 10 pgs.

WIPO, International Search Report and Written Opinion dated Jan. 18, 2022, in PCT/CA2021/051529, 11 pgs.

USPTO, Notice of Allowance dated Feb. 16, 2022, in U.S. Appl. No. 17/514,758, 22 pgs.

Serpengüzel, "Transmission Characteristics of Metallodielectric Photonic Crystals and Resonators", IEEE Microwave and Wireless Components Letters, vol. 12, No. 4, Apr. 2002, 3 pgs.

Yablonovitch, "Inhibited Spontaneous Emission in Solid-State Physics and Electronics", PRL 58, 20, May 18, 1987, 4 pgs.

USPTO, Non-Final Office Action dated May 12, 2022, in U.S. Appl. No. 17/667,281, 46 pgs.

Burford, et al., "Review of terahertz photoconductive antenna technology", Optical Engineering, Jan. 2017, 21 pgs.

Dunn, et al., "High-speed modulation of a terahertz quantum cascade laser by coherent acoustic phonon pulses", Nature Communications, Feb. 2020, 8 pgs.

Federov, et al., "Powerful terahertz waves from long-wavelength infrared laser filaments", Light: Science & Applications, Nov. 2020, 17 pgs.

Feng, et al., "Highly Efficient Spintronic Terahertz Emitter Enabled by Metal-Dielectric Photonic Crystal", Adv. Optical Materials, Oct. 2018, 6 pgs.

Nagatsuma, et al., "Advances in terahertz communications accelerated by photonics", Nature Photonics, May 31, 2016, 9 pgs.

Timofeev, et al., "Generation of high-field narrowband terahertz radiation by counterpropagating plasma wakefields", Physics of Plasmas, Nov. 2016, 10 pgs.

USPTO, Notice of Allowance dated Apr. 25, 2022, in U.S. Appl. No. 17/667,244, 15 pgs.

(56) References Cited

OTHER PUBLICATIONS

Fan , et al., "Effect of Vapor-Cell Geometry on Rydberg-Atom-Based Measurements of Radio-Frequency Electric Fields", Physical Review Applied 4, 044015, 2015, 7 pgs.
Sedlacek , et al., "Atom-Based Vector Microwave Electrometry Using Ribidium Rydberg Atoms in a Vapor Cell", Physical Review Letters, Aug. 6, 2013, 5 pgs.
Barnes , et al., "Injection Seeding I: Theory", IEEE Journal of Quantum Electronics, vol. 29, No. 10, Oct. 1993, 14 pgs.

* cited by examiner

GENERATING ELECTROMAGNETIC RADIATION FROM A PHOTONIC CRYSTAL MASER

BACKGROUND

The following description relates to generating electromagnetic radiation from a photonic crystal maser.

Masers produce coherent electromagnetic radiation through stimulated emission of the atoms or molecules that builds up in the resonator. The stimulated emission produces electromagnetic radiation at an emission frequency of the atoms or molecules that build up in a resonator. A resonator may be used to capture a portion of the stimulated emission from the atoms or molecules so that the photons in the resonator can stimulate more emission into the resonator mode from excited atoms or molecules. To do so, the resonator may have a mode of oscillation that corresponds to the emission frequency of the atoms and molecules, thereby allowing the resonator to "resonate" with the atoms or molecules. The resonator may thus store energy—and by coherent, stimulated emission—amplify the emission of electromagnetic energy from the maser.

DETAILED DESCRIPTION

Figure 1:
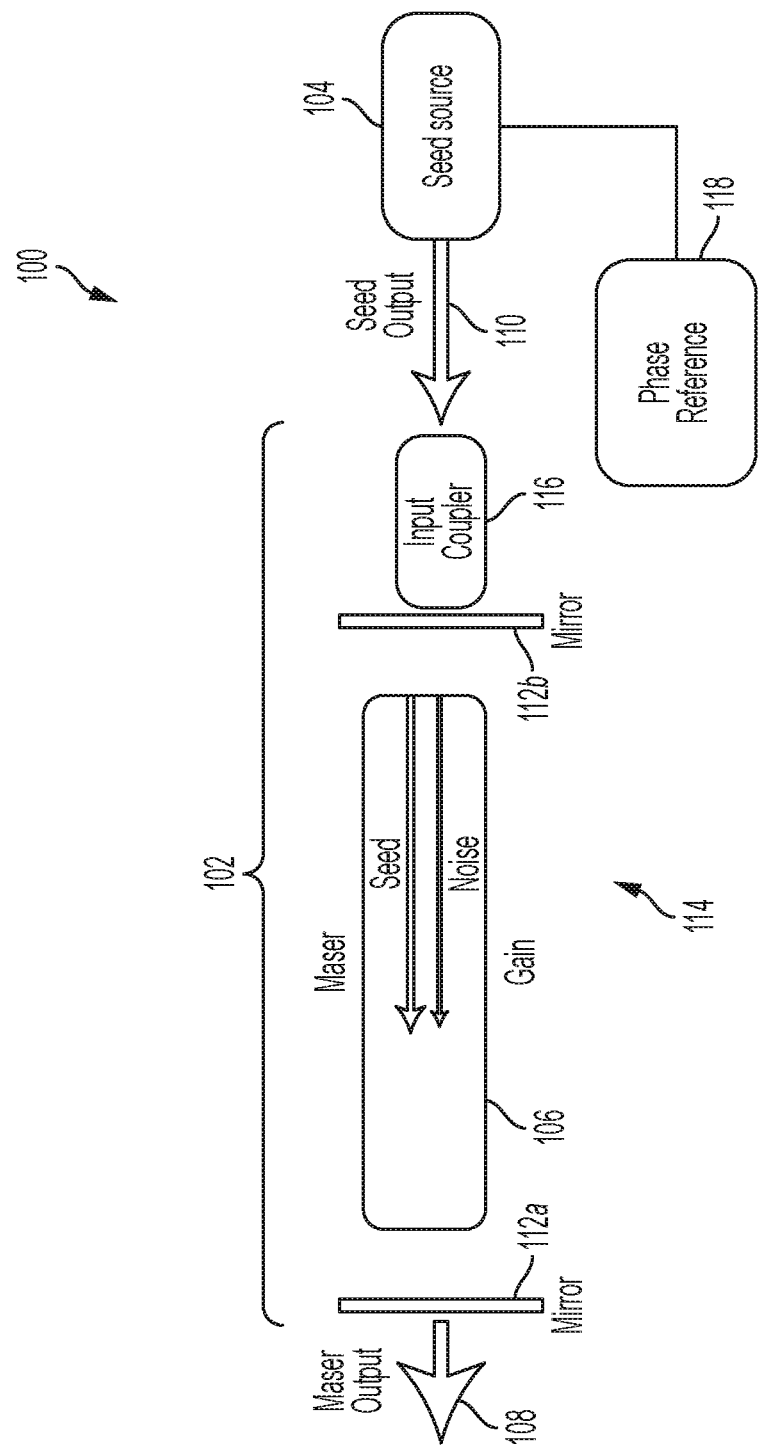
FIG. 1 is a schematic diagram of an example system showing a photonic crystal maser being injection locked to a seed source.

In a general aspect, a photonic crystal maser is disclosed that includes a photonic crystal structure and an input coupler for coupling a reference radiofrequency (RF) electromagnetic radiation to a waveguide of the photonic crystal maser. For example, the photonic crystal maser may include a dielectric body having an array of cavities ordered periodically to define a photonic crystal structure in the dielectric body. The dielectric body may also include a region in the array of cavities defining a defect in the photonic crystal structure. An elongated slot through the region extends from a slot opening in a surface of the dielectric body at least partially through the dielectric body. The elongated slot and the array of cavities may define a waveguide of the dielectric body. The dielectric body may additionally include an input coupler aligned with an end of the elongated slot and configured to couple a reference RF electromagnetic radiation to the waveguide. The reference RF electromagnetic radiation may have one or both of a controlled frequency and a controlled phase.

The photonic crystal maser also includes a vapor (or a source of the vapor) in the elongated slot and an optical window covering the elongated slot. The optical window has a window surface bonded to the surface of the dielectric body to form a seal about the slot opening. In doing so, the optical window may define the vapor cell with the dielectric body. In many variations, the vapor includes one or more input electronic transitions and an output electronic transition coupled to the one or more input transitions. The output electronic transition emits a target radiofrequency (RF) electromagnetic radiation and is resonant with a waveguide mode of the waveguide. Examples of possible electronic transitions include a Rydberg transition, an atomic transition, a molecular transition, and so forth. In some variations, an optical mirror is placed at one or both ends of the elongated slot. In some variations, a photonic crystal mirror is placed at one or both ends of the elongated slot. Other configurations of the photonic crystal maser are possible, as described below.

The photonic crystal maser can be used for communications and other applications where highly directional, low noise, frequency stable, coherent radio frequency sources are needed. For sending signals, controlling the frequency and phase of the photonic crystal maser output may be useful for encoding information in one or both of the phase and frequency. In applications where the efficient generation of RF radiation is required, the frequency and phase can be controlled by injection seeding a higher-power photonic crystal maser with a low power seed oscillator, such as a clock stabilized oscillator. The output of the low power seed oscillator is injected into the photonic crystal maser by coupling the former's output into an antenna or waveguide, which in turn, can be fed into the photonic crystal maser through another coupling element (e.g., an input coupler). In this manner, a small amount of seed RF radiation is efficiently injected into the cavity of the photonic crystal maser. Since the threshold for the photonic crystal maser is small, only a small amount of seed radiation is necessary to injection lock the photonic crystal maser to the low power seed oscillator.

In many variations, the seed radiation is stronger than spontaneous or black-body processes and zero-point population of the masing mode to lock the photonic crystal maser. The phase and frequency stability of the low power seed oscillator is transferred to the photonic crystal maser by the injecting seeding. In these variations, the photonic crystal maser may be used as an extremely low-noise amplifier that produces a highly directional and coherent output from the seed radiation. The photonic crystal maser may also be optically pumped so the size, weight, and power (SWaP) of any resulting system can be smaller than a traditional stabilized maser. The photonic crystal maser can operate around room temperature and be constructed so that it emits at any frequency near a Rydberg transition. In this case, the photonic crystal maser may be a Rydberg atom maser. The frequency range of a target RF electromagnetic radiation from the photonic crystal maser can span from MHz-THz, with a ~Hz-~100 MHz spectral bandwidth. The low power seed oscillator can tune the photonic crystal maser across the bandwidth of the maser cavity and gain medium as well as fix the output phase to the external clock. The frequency can similarly be locked to the clock output by preventing drift of the seed frequency.

Now referring to FIG. 1, a schematic diagram is presented of an example system 100 showing a photonic crystal maser 102 being injection locked to a seed source 104. The seed source 104 may operate at a lower power than the photonic crystal maser 102. The photonic crystal maser 102 includes a gain medium 106 (e.g., a vapor) that is operable to generate a target RF electromagnetic radiation 108 in response to receiving an optical signal (not shown) and a reference RF electromagnetic radiation 110 (or seed output) from the seed source 104. The gain medium 106 may be disposed between two mirrors 112a, 112b, which facilitate the build-up of RF electromagnetic radiation in the gain medium 106 until a threshold intensity is reached. The two mirrors 112a, 112b may help define a maser cavity 114 of the photonic crystal maser 102.

The photonic crystal maser 102 also includes an input coupler 116 that couples the reference RF electromagnetic radiation 110 to a waveguide of the photonic crystal maser 102. The input coupler 116 may reduce a loss of coupling between the seed source 104 and the maser cavity. During operation, the intensity of the reference RF electromagnetic radiation 110 is strong enough to overcome noise in the maser cavity 114 (e.g., spontaneous emission, black-body radiation, etc.). Such an intensity allows the seed source 104 to control the output of the photonic crystal maser 102. The seed source 104 may be a tunable radio frequency source whose tuning range covers (or nearly covers) the operational range of the photonic crystal maser 102. In some instances, such as shown in FIG. 1, the seed source 104 is referenced to a phase reference 118 such as a temperature stabilized crystal oscillator or other type of clock. The reference RF electromagnetic radiation 110 is coupled through window 112b, which is partially transmitting. The input coupler 116 matches the seed output mode to the cavity mode (or waveguide mode) of the photonic crystal maser 102.

In some applications, there may be a necessity to control the frequency and phase of the photonic crystal maser. Controlling the frequency and phase (and possibility the amplitude) can enable the encoding of signals. The encoding of signals onto an output of the photonic crystal maser may be advantageous for use-cases such as communications and radar. In these cases, the coherence and directionality of the radio frequency emission from the photonic crystal maser can also be useful, making the photonic crystal maser a device of choice in such applications. Controlling phase and frequency is advantageous for timing applications as the photonic crystal maser can be locked to a clock, such as a GPS timing signal, and then used as a local oscillator. A collection of ground stations for radar or communications can then use phase sensitive detection such as heterodyning to improve signal detection in a radar network or communications network. A phase and frequency locked photonic crystal maser can also be used to efficiently transfer a timing signal to other locations.

One way to control the frequency and phase of photonic crystal masers is through injection locking. For this method, timing with clocks, or clock signals, may be used to frequency and phase lock a radio frequency source that emits a low intensity signal. The low intensity output of the radio frequency oscillator can be coupled into the maser cavity to bias its emission to the particular frequency and phase of the low power oscillator. By 'seeding' the photonic crystal maser with a particular radio frequency wave where the frequency and phase are chosen, the stimulated emission that generates the maser output is preferentially favored to occur at the chosen phase and frequency. Once this occurs, the exponential cascade of the inverted population into the favored mode by stimulated emission suppresses masing at other frequencies and phases. The photonic crystal maser can then mimic the output of the seed to produce a fixed phase and frequency directional, coherent output at larger power.

Advantages of injection seeding are that the low power injection seed may be effectively converted into a highly coherent, directional beam with larger intensity and overall power. The injection seed is straightforward to construct and configure with clocks, like chip scale atomic clocks and crystal oscillators, and low power radio frequency equipment. Total control of the emission frequency and phase may be possible in certain cases and may be easier than with a photonic crystal maser alone because of the relatively long emission wavelength compared to a laser. The uncertainty in the phase of the photonic crystal maser, if it is initiated by random processes like spontaneous emission or blackbody radiation, may be represented by $\Delta\phi \geq 2\pi\lambda/l$, where $l$ is the length of the cavity and $\lambda$ is the wavelength. Typically, $\lambda/l \approx 0.1$, making $\Delta\phi \approx \pi/5$, which is large for many applications. The spectral bandwidth of the photonic crystal maser can be ~1-10 MHz, which is large for many timing applications. The frequency stability can be improved to better than 1 part in $10^{12}$ by locking the seed source to a GPS clock and using it to control the output of the photonic crystal maser. Such stability is suitable for time transfer applications and can be accomplished by injection seeding with even a low-quality oscillator locked to a GPS clock.

Because the photonic crystal maser may have a low masing threshold, the seed power can be small. In these cases, the reference RF electromagnetic radiation from the seed source only has to overcome the noise levels of the oscillator. For example, the seed intensity, after overcoming the coupling loss into the maser cavity and propagation loss within the maser cavity, may need to beat out spontaneous emission, black body radiation within the cavity, and the zero-point energy of the field modes. Spontaneous emission may be no greater than ~1 kHz, while values <100 Hz are more typical. The zero-point energy of the field modes is small compared to black body radiation and the spontaneous emission for Rydberg transitions. In many cases, the zero-point energy can be effectively ignored. On the transition itself, the seed only need be ~10's of Hz of Rabi frequency in some cases.

In the absence of a seed, the natural seed for the photonic crystal maser may be produced by spontaneous emission or by black body radiation. The phase is random when the masing is initiated and the frequency may be that whose combination of emission rate is largest and loss in the maser cavity is least. As the injection seeding is increased in power compared to the power of the noise sources that are effectively coupled to the cavity, a larger fraction of the maser output mirrors the properties of the seed. When the seed is powerful compared to the noise sources, the maser will frequency lock to the seed. During such locking, the mode of the photonic crystal maser that is seeded (e.g., a waveguide mode of the photonic crystal maser) extracts energy from the gain media. In many instances, the seed is resonant, or near-resonant, with the inverted transition. Normally, spontaneously emitted photons begin to extract energy from the gain media and amplify the number of photons in a particular mode. Injection locking takes place when the seed signal frequency (nearly) matches the resonant mode of the maser cavity (or waveguide), sufficient to overcome the possibility that spontaneous emission and black body radiation steal a substantial amount of energy from the gain medium.

Figure 2A:
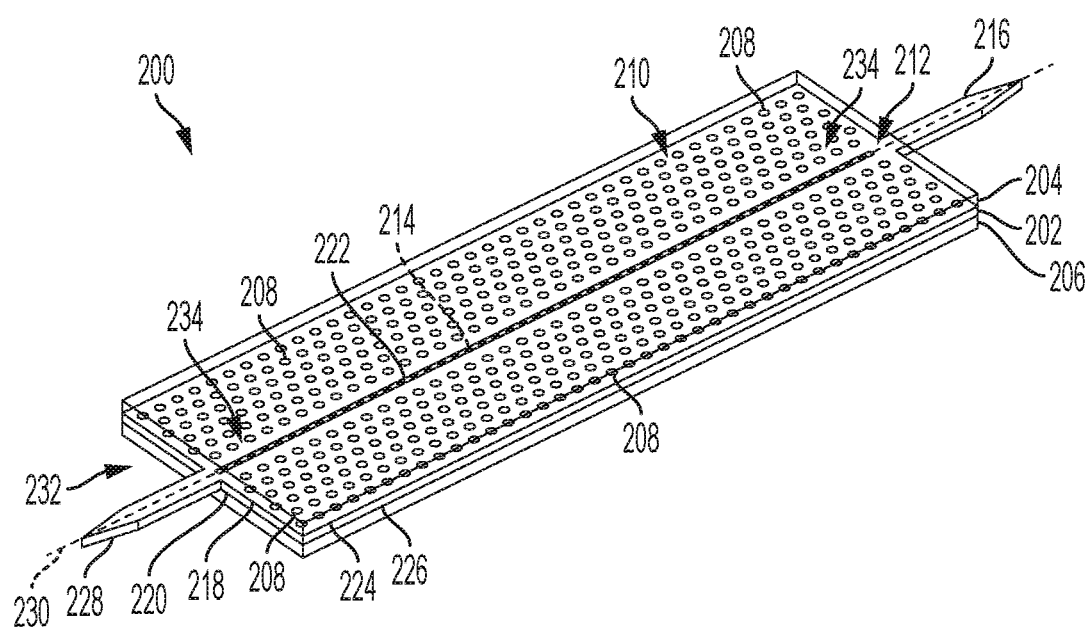
FIG. 2A is a schematic diagram, in perspective view, of an example photonic crystal maser that includes a dielectric body bonded to two optical windows.

Now referring to FIG. 2A, a schematic diagram, in perspective view, of an example photonic crystal maser 200 that includes a dielectric body 202 bonded to two optical windows 204, 206. The photonic crystal maser 200 may be analogous to the photonic crystal maser 102 described in relation to FIG. 1. The dielectric body 202 includes an array of cavities 208 ordered periodically to define a photonic crystal structure 210 in the dielectric body 202. For example, the cavities 208 of the array may be disposed on respective sites of a two-dimensional lattice, such as an oblique lattice, a square lattice, a rectangular lattice, a hexagonal lattice, a rhombic lattice, and so forth. In FIG. 2A, each cavity 208 is defined by a through-hole. However, other shapes are possible for the cavities 208 (e.g., blind holes, internal voids, etc.), including combinations of shapes. The dielectric body 202 also includes a region 212 (or defect region) in the array of cavities 208 defining a defect in the photonic crystal structure 210. The region 212 may be defined by an absence of cavities 208 on two or more contiguous sites of a two-dimensional lattice. In FIG. 2A, the region 212 is a linear region having a row of cavities 208 absent. However, other geometries are possible, including curved, circular, elliptical, serpentine, square, rectangular, hexagonal, and so forth.

The dielectric body 202 may be formed of a material substantially transparent to RF electromagnetic radiation. The material may be an insulating material having a high resistivity, e.g., $\rho > 10^3 \Omega \cdot cm$, and may also correspond to a single crystal material, a polycrystalline material, or an amorphous (or glass) material. For example, the dielectric body 202 may be formed of silicon. In another example, the dielectric body 202 may be formed of a glass that includes silicon oxide (e.g., $SiO_2$, $SiO_x$, etc.), such as vitreous silica, a borosilicate glass, or an aluminosilicate glass. In some instances, the material of the dielectric body 202 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In certain variations, the combination may correspond to $BaLn_2Ti_4O_{12}$ where Ln refers to one or more elements from the lanthanide group of the periodic table of elements. In other instances, the material of the dielectric body 202 is a non-oxide material such as silicon (Si), diamond (C), gallium nitride (GaN), calcium fluoride (CaF), and so forth.

The dielectric body 202 additionally includes an elongated slot 214 through the region 212 that extends from a slot opening in a surface of the dielectric body 202 at least partially through the dielectric body 202. In FIG. 2A, the elongated slot 214 extends completely through dielectric body 202 to a second slot opening. The elongated slot 214 and the array of cavities 208 define a waveguide of the dielectric body 202. During operation, the waveguide may direct RF electromagnetic radiation (or waves thereof) along an axis of the region 212, such as towards an end of the dielectric body 202. The dielectric body 202 also includes an input coupler 216 aligned with an end of the elongated slot 214 and configured to couple a reference radiofrequency (RF) electromagnetic radiation (e.g., from a seed source) to the waveguide. The reference RF electromagnetic radiation has one or both of a controlled frequency and a controlled phase. In some instances, the reference RF electromagnetic radiation is resonant with a waveguide mode of the waveguide. In some instances, such as shown in FIG. 2A, the input coupler 216 extends from a side of the dielectric body and terminates in a tapered end. However, other positions and geometries are possible. The input coupler 216 is described further in relation to FIGS. 3A-3B.

The example photonic crystal maser 200 also includes a vapor (or a source of the vapor) in the elongated slot 214. The vapor may include constituents such as a gas of alkali-metal atoms (e.g., Rydberg atoms), a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents. The source of the vapor may generate the vapor in response to an energetic stimulus, such as heat, exposure to ultraviolet radiation, irradiation by laser light, and so forth. For example, the vapor may correspond to a gas of alkali-metal atoms and the source of the vapor may correspond to an alkali-metal mass sufficiently cooled to be in a solid or liquid phase when disposed into the elongated slot 214.

In many implementations, the vapor has electronic transitions that are defined between pairs of electron energy levels (e.g., a Rydberg transition, an atomic transition, a molecular transition, etc.). In particular, the vapor includes one or more input electronic transitions and an output electronic transition coupled to the one or more input electronic transitions. The output electronic transition is operable to emit a target RF electromagnetic radiation and is resonant with one or more waveguide modes of the waveguide. In some implementations, the output electronic transition and the reference RF electromagnetic radiation are resonant with the same waveguide mode(s) of the waveguide. In some implementations, the example photonic crystal structure 200 includes a laser (e.g., a pump laser) configured to generate an optical signal capable of exciting the one or more input electronic transitions of the vapor. However, other energy sources are possible (e.g., a source of radio-frequency photons). In some implementations, the output electronic transition is operable to emit a target RF electromagnetic radiation having a frequency in a range from 100 MHz to 1 THz.

The photonic crystal structure 210 may define a photonic band gap for the target RF electromagnetic radiation in the waveguide. The photonic band gap may be for a transverse magnetic (TM) mode, a transverse electric (TE) mode, or both, of the target RF electromagnetic radiation in the waveguide. The photonic band gap may allow the photonic crystal structure 210 to influence properties of the target RF electromagnetic radiation. For example, the photonic crystal structure 210 may be configured to concentrate the target RF electromagnetic radiation in the elongated slot 214. The photonic crystal structure 210 may also be configured to decrease a group velocity of the target RF electromagnetic radiation (or waves thereof) along a direction of the elongated slot 214 (e.g., along an axis of the elongated slot 214). Such influence may allow the photonic crystal structure 210 to control an absorption and emission of photons by the vapor.

In some implementations, the elongated slot 214 extends partially through the dielectric body 202 and the dielectric body 202 includes a surface defining a slot opening of the elongated slot 214. In these implementations, the example photonic crystal receiver 200 includes an optical window (e.g., optical window 204) that covers the elongated slot 214 and has a window surface bonded to the surface to form a seal about the slot opening. Such sealing may assist the optical window and dielectric body 202 in sealing the vapor (or the source of the vapor) in the elongated slot 214, thereby defining a vapor cell within the region 212. The optical window may be bonded to the dielectric body 202 using a contact bond, an anodic bond, a glass frit bond, and so-forth.

Such bonds may be formed using techniques described in U.S. Pat. No. 10,859,981 entitled "Vapor Cells Having One or More Optical Windows Bonded to a Dielectric Body," the disclosure of which, is incorporated herein by reference in its entirety.

The optical window may be formed of a material that is transparent to electromagnetic radiation (e.g., laser light) used to stimulate the vapor to emit the target RF electromagnetic radiation. For example, the optical window may be transparent to infrared wavelengths of electromagnetic radiation (e.g., 700-5000 nm), visible wavelengths of electromagnetic radiation (e.g., 400-700 nm), or ultraviolet wavelengths of electromagnetic radiation (e.g., 10-400 nm). Moreover, the material of the optical window may be an insulating material having a high resistivity, e.g., $\rho > 10^3 \pi \cdot cm$, and may also correspond to a single crystal material, a polycrystalline material, or an amorphous (or glass) material. For example, the material of the optical window may include silicon oxide (e.g., $SiO_2$, $SiO_x$, etc.), such as found within quartz, vitreous silica, or a borosilicate glass. In another example, the material of the optical window may include aluminum oxide (e.g., $Al_2O_3$, $Al_xO_y$, etc.), such as found in sapphire or an aluminosilicate glass. In some instances, the material of the optical window is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, $BaLn_2Ti_4O_{12}$, etc.). In other instances, the material of the optical window is a non-oxide material such as diamond (C), calcium fluoride (CaF), and so forth.

In some implementations, the surface of the dielectric body 202 defines a cavity opening for each of the array of cavities 208. The optical window may or may not cover each of the cavity openings. In implementations where the optical window does cover each of the cavity openings, the window surface of the optical window may form a seal about each of the cavity openings.

In some implementations, the elongated slot 214 extends entirely through the dielectric body 202. For example, as shown in FIG. 2A, the dielectric body 202 may include a first surface 218 opposite a second surface 220 and the elongated slot 214 extends through the dielectric body 202 from the first surface 218 to the second surface 220. The first surface 218 may define a first slot opening 222 for the elongated slot 214 and the second surface 220 may define a second slot opening (not shown) for the elongated slot 214. In these implementations, the example photonic crystal maser 200 includes first and second optical windows 204, 206 covering, respectively, the first and second slot openings of the elongated slot 214. The first and second optical windows 204, 206 each have a window surface bonded to the surface of the dielectric body 202 and may seal the vapor (or the source of the vapor) in the elongated slot 214 to define a vapor cell. In such cases, the first optical window 204 may cover the first slot opening 222 and may have a first window surface 224 bonded to the first surface 218 of the dielectric body 202 to form a seal about the first slot opening 222. Similarly, the second optical window 206 may cover the second slot opening and may have a second window surface 226 bonded to the second surface 220 of the dielectric body 202 to form a seal about the second slot opening.

In implementations where the example photonic crystal maser 200 includes first and second optical windows 204, 206, the first and second surfaces 218, 220 of the dielectric body 202 may define, respectively, first and second cavity openings for each of the array of cavities 208. In these implementations, the first and second optical windows 204, 206 may or may not cover, respectively, each of the first and second cavity openings. In implementations where they do, the first window surface 224 may form a seal about each of the first cavity openings and the second window surface 226 may form a seal about each of the second cavity openings.

In some implementations, the example photonic crystal maser 200 includes an output coupler 228 configured to impedance match the target RF electromagnetic radiation to an ambient environment of the photonic crystal maser 200. In these implementations, the region 212 in the array of cavities 208 may extend along an axis 230 and the elongated slot 214 may be aligned parallel to the axis 230 (e.g., be coincident with the axis 230). The dielectric body 202 then includes the output coupler 228, which may extend from an end 232 (or side) of the dielectric body 202 and be aligned with the axis 230. The output coupler 228 may be an integral part of the dielectric body 202 but may also be a separate body. If separate, the output coupler 228 may be formed of dielectric material. However, the output coupler 228 may also be a conventional coupler formed of metal. FIG. 2A shows the output coupler 228 as a protrusion from the dielectric body 202 that terminates in a taper. However, other geometries are possible for the output coupler 228.

In some implementations, the output coupler 228 is electromagnetically coupled to an output mirror, such as a photonic crystal mirror 234, to impedance match an output beam to a medium (e.g., air) in which the output beam is intended to propagate. The photonic crystal mirror 234 may be defined by one or more offset cavities spatially offset from an ideal periodic position in the array. The one or more offset cavities may reside nearest an end of the elongated slot 214 (e.g., end 232) and have respective spatial offsets away from the end of the elongated slot 214. The one or more offset cavities may also reside nearest a side of the elongated slot 214 and have respective spatial offsets away from the side of the elongated slot 214. Other locations are possible. A lens may also be added to collimate the output beam. In some variations, the elongated slot 214 may be tapered (e.g., in width along its axis). Such tapering may assist in the formation of the photonic crystal mirror 234.

In some implementations, a polarizer may be added to the output coupler 228 to filter a polarization of the output beams. For example, the output coupler 228 may terminate in a tapered end and include a narrow portion aligned with the tapered end. An array of co-planar segments may extend outward from the narrow portion and have a periodic spacing therealong. The array of co-planar segments may be configured to filter a polarization of the target RF electromagnetic radiation.

In some implementations, the photonic crystal mirror 234 is placed at one or both ends of the elongated slot 214. FIG. 2A shows the case in which the photonic crystal mirror 234 is present at both ends of the elongated slot 214. The presence of the photonic crystal mirror 234 may increase the output power, may lower the gain threshold of the maser, or both. For example, the photonic crystal mirror 234 may reflect electromagnetic radiation that traverses the region 212 during operation (e.g., the target RF electromagnetic radiation emitted by the vapor during operation of the example photonic crystal maser 200). In this capacity, the region 212 may serve as part of a maser cavity, such as the interior of a maser cavity. Moreover, the photonic crystal mirror 234 may assist the array of cavities 208 and the elongated slot 214 in defining a cavity structure (e.g., a slot waveguide) for electromagnetic radiation emitted by the vapor.

In many variations, the photonic crystal mirror 234 corresponds to an alteration in the dimensional characteristics of the photonic crystal structure 210 near an end of the elongated slot 214. For example, transmission of the target RF electromagnetic radiation through the photonic crystal structure 210 at the ends of the elongated slot 214 can be altered by changing a spacing of cavities 208 in the array, a thickness of the dielectric body 202, a diameter of the cavities 208 in the array, and so forth. It will be appreciated that, in the dielectric body 202, a perfect photonic crystal geometry for the target RF electromagnetic radiation (or resonant wave) may act as a perfect reflector, while the absence of the photonic crystal may act as a perfect transmitter.

In some implementations, the photonic crystal mirror 234 is configured with a reflectivity greater than 80% for frequencies of electromagnetic radiation at or near a cavity (or waveguide) resonant frequency, $\omega_c$, of the photonic crystal structure 210. This reflectivity may increase a cavity quality factor, Q, associated with the photonic crystal structure 210 (or region 212 therein), thereby lowering a threshold condition for masing to take place. In some variations, the reflectivity is greater than 85%. In some variations, the reflectivity is greater than 90%. In some variations, the reflectivity is greater than 92%. In some variations, the reflectivity is greater than 94%. In some variations, the reflectivity is greater than 96%.

In some implementations, an optical mirror (not shown) is placed at one or both ends of the elongated slot 214. The optical mirror may be angled relative to an optical pathway defined by the elongated slot 214, or alternatively, be angled perpendicular to the optical pathway. The optical mirror may serve to guide optical signals along a longitudinal axis of the elongated slot, such as axis 230. To do so, the optical mirror may include surfaces configured to reflect such optical signals. The optical signals may include light received into the elongated slot 214 from the laser.

In some implementations, the vapor is a vapor of atoms in which each atom can function as an emitter. During operation, the photonic crystal structure 210, which surrounds the elongated slot 214, may slow and concentrate an electromagnetic wave at an atomic transition frequency of the atoms. The atoms are pumped with the laser(s) so that a population inversion is established on an atomic u→l transition, which is resonant with a resonant mode (or waveguide mode) of the waveguide. Emission of radiation into the resonant mode of the waveguide can be enhanced because the electric field is stronger, favoring emission. Stimulated emission dominates, creating a coherent directed maser beam along the waveguide that can be impedance matched and shaped for free-space propagation. Photonic crystal mirrors can be implemented at the ends of the elongated slot 214 so the radiation can propagate back and forth in the elongated slot 214 and be further amplified. The elongated slot 214 takes the energy stored in the population inversion and causes it to be emitted into the waveguide mode resulting in a coherent, directed beam of radiation. Analogous operation is possible for implementations of the example photonic crystal maser 200 in which the vapor is a vapor of molecules.

The example photonic crystal maser 200 may be constructed in a manner suitable for mass production. The example photonic crystal maser 200 may also be combined with a Rydberg atom receiver, Rydberg atom vapor cell sensor, or array of Rydberg atom vapor cell sensors to create devices that can receive and transmit RF radiation. The amount of power outputted by the example photonic crystal maser 200 may be controlled to extraordinarily low levels by changing an intensity of the laser. Moreover, the switching time may be nanoseconds because cavity lifetimes can be on this scale. Because of the nanosecond lifetimes and the ability to modulate the laser at GHz bandwidths, modulating the laser can imprint baseband modulations on the carrier frequency on the same frequency scale (e.g., GHz).

Figure 2B:
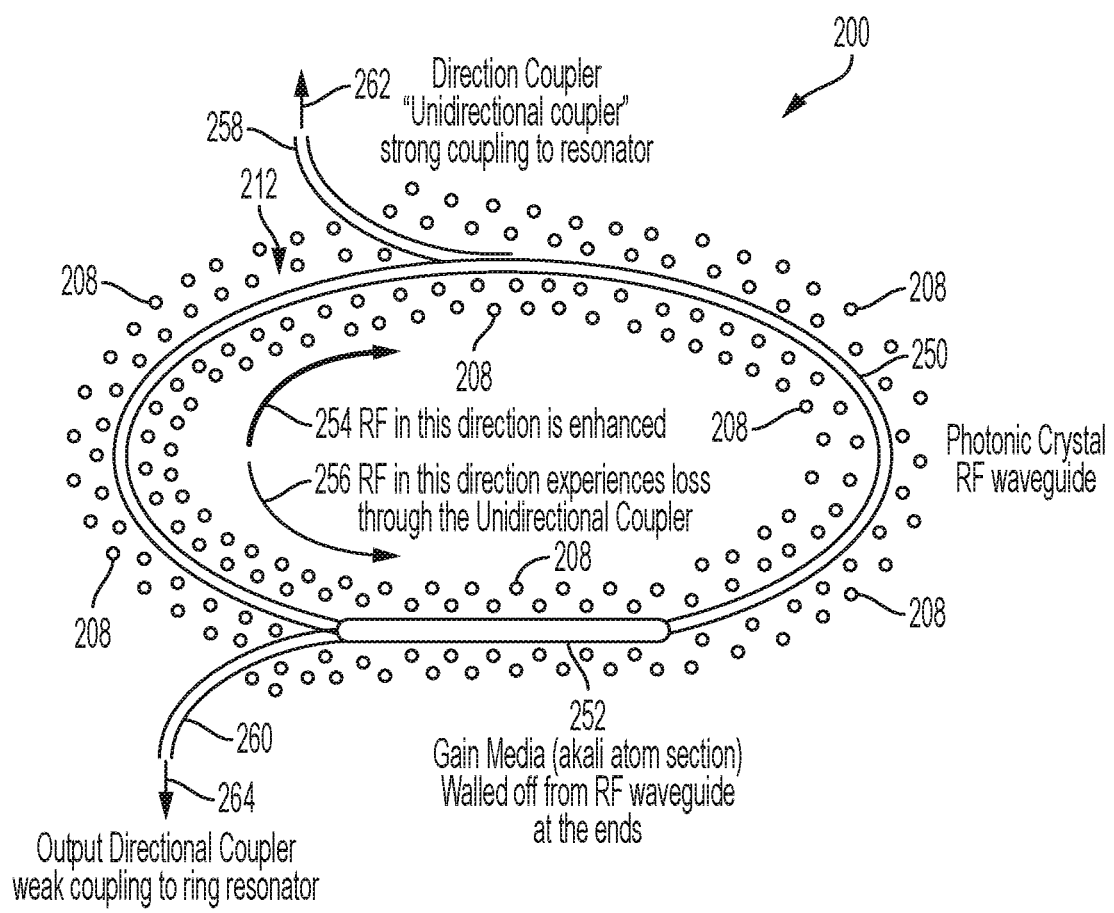
FIG. 2B is a schematic diagram, in top view, of the example photonic crystal receiver of FIG. 2A, but in which dielectric body includes a ring resonator structure.

Although FIG. 2A depicts the example photonic crystal maser 200 as having a linear region 212 and a linear elongated slot 214, other geometries are possible. For example, FIG. 2B presents a schematic diagram, in top view, of the example photonic crystal receiver 200, but in which dielectric body 202 includes a ring resonator structure. In particular, the region 212 forms a loop (e.g., an elliptical loop) in the array of cavities 208. In many variations, the loop is a closed loop, such as circle, an ellipse, an oblong, and so forth. The elongated slot 214 extends along a loop axis (e.g., an elliptical axis) of the loop to form a looped slot 250 (e.g., an elliptical slot). All or a portion of the looped slot 250 may be partitioned off (e.g., by transparent walls, lenses, mirrors, etc.) to contain the vapor or the source of the vapor. FIG. 2B shows the case in which a portion 252 of the looped slot 214 contains the vapor or the source of the vapor. In some variations, such as shown in FIG. 2B, the array of cavities 208 forms a loop. However, other distributions are possible for the array of cavities 208.

The looped slot 250 may be associated with first and second loop directions 254, 256 along the loop axis, with the first loop direction 254 being opposite the second loop direction 256. In these configurations, the looped slot 250 includes first and second RF ports 258, 260. First and second directional couplers 262, 264 are coupled to, respectively, the first and second RF ports 258, 260. The first directional coupler 262 is configured to receive a first portion of the target RF electromagnetic radiation traveling along the first loop direction, and the second directional coupler 264 is configured to receive a second portion of the target RF electromagnetic radiation traveling along the second loop direction. In many variations, the first directional coupler 262 is more strongly coupled to the looped slot 250 than the second directional coupler 264.

A looped configuration for the region 212 and elongated slot 212 may bring some advantages over a linear configuration in certain cases. For example, the linear configuration allows the target RF electromagnetic radiation, when emitted, to travel principally along two opposite directions, such as along a linear axis of the elongated slot 214. During such travel, the target RF electromagnetic radiation may be amplified by interacting with the vapor, which can operate as a gain medium. However, this dual-direction travel may also allow photons associated with the traveling target RF electromagnetic radiation—e.g., waves of photons traveling forwards and backwards in the elongated slot 214—to interfere with each other and establish a standing wave of the target RF electromagnetic radiation in the elongated slot 214. This standing wave is associated with a series of minimum and maximum field intensities along a length of the elongated slot 214. The minimums may result in little to no stimulated emission at some portions of the vapor while the maximums may saturate the emission at other portions. The maximums may be particularly undesirable if their electromagnetic field energy is greater than can be absorbed by the vapor at their locations. As a result, the standing wave of target RF electromagnetic radiation may not efficiently use the vapor in the elongated slot 214. The target RF electromagnetic radiation may saturate the output power at lower magnitudes of field strength than if all the vapor were used.

In contrast, the looped configuration can, in certain cases, more efficiently use the vapor by incorporating directional couplers and establishing a traveling wave of the target RF electromagnetic radiation. For example, a high-efficiency directional coupler (e.g., first directional coupler 262) may serve as a unidirectional device at the first RF port 258 of the looped slot 250 and a low-efficiency directional coupler (e.g., second directional coupler 264) can be used as an output coupler at the second RF port 260 of the looped slot 250. In the looped configuration, first photons circulating in the first loop direction 254 (e.g., a clockwise direction) are coupled out of the looped waveguide with low-efficiency and second photons circulating in the second loop direction 256 (e.g., a counterclockwise direction) are coupled out of the cavity with high efficiency. The loss of the second photons is designed to be enough that second photons, when interacting with the vapor, do not reach the masing threshold. In contrast, the first photons are strong enough so that, when interacting with the vapor, the first photons extract all the energy from the gain medium. In this situation, the target RF electromagnetic radiation forms a traveling wave (especially in the vapor) and the entire vapor can therefore be used as a gain medium to provide energy for masing. Moreover, the traveling wave allows the vapor to be selectively constrained within a portion of the looped slot 250. An entire volume of the looped slot 250 need not be filled with the vapor. The portion may be selected in length and position to maximize a participation of the vapor in stimulated emission.

For the photonic crystal maser to transmit signals, its amplitude, phase and frequency may be controlled so that information can be encoded in the output signal. In addition, multiple photonic crystal masers may be phase and frequency locked so that they are mutually coherent. Having the photonic crystal masers mutually coherent may allow techniques such as heterodyning to be used for signal detection. Other coherent techniques are possible. Coherent masers also can be made to transmit timing signals and can be used for holography. These techniques have use in communications, time transfer, non-destructive testing, and radar, for example. The photonic crystal maser has a high directionality so it has advantages for applications like point-to-point communications. In contrast, antennas typically have a low directionality.

The photonic crystal masers can also have high spectral purity compared to other radio frequency sources. Because a photonic crystal maser is a resonant device where the structure can be resonant with a single electronic transition (e.g., a Rydberg transition), other frequencies are not emitted (e.g., spurs or harmonics). The photonic crystal maser exhibits high spectral purity because the electronic transition is narrow. Moreover, the wavelengths emitted by the photonic crystal maser can also pass through materials that laser emissions cannot, including human tissue. As a consequence, the photonic crystal maser can be used for imaging applications in non-destructive testing and medical diagnostics. For example, the photonic crystal maser may be used to image the contents of shipments or detect people through walls. In some implementations, the photonic crystal maser is a source that uses the same lasers and concepts as Rydberg atom-based electrometry. In some implementations, the photonic crystal maser is an all-dielectric device. It can, for example, serve as a source or local oscillator for a Rydberg atom-based receiver or a vapor cell sensor without adding metal to the setup. All-dielectric technologies are more electromagnetically transparent than technologies based on metal components. As such, the photonic crystal maser can be effectively paired with Rydberg atom receivers and sensors to build an all-dielectric transceiver.

In many implementations, the photonic crystal maser (e.g., the photonic crystal maser 200 of FIGS. 2A or 2B) includes a reference RF oscillator (or seed source) configured to produce a reference RF electromagnetic radiation. The reference RF oscillator is electromagnetically coupled to an input coupler (e.g., the input coupler 216 of dielectric body 202). The reference RF oscillator may allow the photonic crystal maser to be injection seeded with the reference RF electromagnetic radiation. Injection seeding is the process by which the output of a higher power RF oscillator (e.g., a photonic crystal maser) can be controlled by a lower output power RF oscillator, the so-called seed. The phase and frequency of the higher power RF oscillator can be controlled as these quantities mirror those of the seed. For example, the phase and frequency of a Rydberg atom maser can be controlled by injection seeding from a low power radio frequency source. The source can have spurs or amplitude noise and still fix the phase and frequency of the Rydberg atom maser. As such, it is possible to obtain a fixed phase and frequency from the seed even with a low quality, inexpensive seed oscillator. The seed oscillator can be low quality because the Rydberg atom maser acts as a filter for spurs in the seed oscillator output and the amplitude fluctuations only have to beat out the competitive processes by which masing starts, spontaneous emission, black body radiation, and zero-point energy in the field modes. Conventional radio frequency equipment may allow for the control of phase and frequency of the seed oscillator by referencing the output of the seed oscillator to a clock using devices like phase locked loops.

In many implementations, masing in the photonic crystal maser occurs through a population inversion on an atomic or molecular transition. In the case of a Rydberg atom maser, the population inversion takes place in a gas of alkali atoms on a Rydberg transition. Once the population inversion is achieved, feedback may be used to sustain maser operation. Feedback may be provided by a maser cavity, which is constructed around the gain medium (or vapor). For the photonic crystal maser, the maser cavity is formed by the photonic crystal structure. Reflective mirrors are engineered into the photonic crystal at the ends of the elongated slot (e.g., see mirrors 112*a,b* of FIG. 1). The gain medium fills the channel and is pumped via lasers by reflecting the light off optical mirrors placed at the ends of the channel. The holes in the structure may slow the radio frequency wave, increasing its interaction with the gain medium. Other geometries are possible. For example, the maser cavity could be a travelling wave cavity constructed by making the waveguide for the radio frequency circular (e.g., a loop). Almost any shape can be created using the waveguide as long as the bend radius of the different parts of the structure are not too lossy. In the case of a circular maser cavity, the gain medium or slot can run along one of the edges, such as a flattened part along an edge of the circular waveguide. A directional coupler can be engineered into the loop so that radio frequency photons travelling in a particular direction are coupled out of the maser cavity. The directional coupler acts as a unidirectional device so that masing occurs predominantly (or completely) in one direction, since the radio frequency photons coupled to the directional coupler can be expelled from the cavity causing loss. The implementation of this unidirectional configuration may prevent interference between the waves travelling in the forward and backward directions, which would otherwise lead to lower maser output power. In some instances, a unidirectional cavity lacks 'hot spots' therein and leads to higher output power.

Masing can occur when photons build-up inside the maser cavity via stimulated emission. Stimulated emission yields coherent photons that exponentially grow in number inside the cavity. As the photons bounce back and forth between the end mirrors of the cavity, they trigger more coherent emission into the masing mode. The output of the maser leaks out of one of the cavity end-mirrors, which is designed to be partially transmitting (e.g., the mirror 112a of FIG. 1). The mirror transmission usually limits the ultimate number of trips a photon can make inside the maser cavity.

During the initial stage of masing, the frequency and phase of the maser output may be determined by the first photon. Usually, the first photon is generated through spontaneous emission in the gain medium, thus the phase is random and the frequency is statistically determined by the nature of the maser cavity (e.g., how much feedback at a particular frequency, the spectral profile of the gain medium, etc.). Since spontaneous emission can occur in all directions, only those photons that can couple into the maser cavity are 'useful' for initiating the masing. Useful photons may be those that are emitted into the solid angle subtended by the maser cavity. For a photonic crystal maser at room temperature, black body emission from the walls of the structure (e.g., or dielectric body) can also generate photons that can initiate masing. Generally, the number of photons generated by black body radiation and spontaneous emission is much larger than the zero-point energy of the electromagnetic field modes of the maser cavity, but zero-point energy photons can also initiate masing. For a laser, black body emission is negligible because the frequency of light is much larger than the radio frequencies emitted by the maser. In other words, the modes of the field at laser frequencies are not thermally populated.

To control the maser frequency and phase, the photonic crystal maser can be biased towards a photon that initiates the masing while suppressing competition from photons that lack desired properties (e.g., different frequencies, random phases, etc.). Injection seeding may be used to bias the photonic crystal maser. In this approach, injection seeding is used to supply photons that seed the masing. The number of photons, or power, that are required may depend on a design of the maser cavity and the operation frequency, through the inverted transition emission rates or spectral characteristics of the gain medium.

In some implementations, the strength of the external seeding electromagnetic field in the maser cavity is large when compared to the useful spontaneous emitted, black body generated, and zero-point populated electromagnetic field. The seed electromagnetic field (or reference RF electromagnetic radiation) must be coupled into the maser cavity (or waveguide), since it is generated externally to the photonic crystal maser. Its coupling into the maser cavity can be characterized by a transmission factor for the end-mirror through which the seed electromagnetic field is injected and a mode matching factor that characterizes how much of the seed electromagnetic field is efficiently mode matched to the maser mode (or waveguide mode). An electric field approach can be useful because the phase can be retained. The seed electromagnetic field inside the maser cavity, $E_{sc}$, can then be related to the seed delivered by the conventional electronics, $E_s$, as shown in Eq. (1):

$$E_{sc} = \sqrt{T_m} \, c_0 E_s \qquad \text{Eq. (1)}$$

Here, $T_m$, is the conventional transmission factor for the intensity and $c_0$ is the mode overlap between the external mode and the cavity mode, taking into account the mode matching structures, if present. $E_{sc}$ should exceed the noise levels due to spontaneous emission, $E_{sp}$, black body emission, $E_{bb}$, and the zero-point energy of the electric field, $E_0$, including each gain factor inside the oscillator, to control the masing frequency and phase, $E_n = E_{sp} + E_{bb} + E_0$. The gain factor is important because a small noise signal with a large gain can win out in the end if $E_{sc}$ is large but detuned from the cavity resonance frequency enough to experience a sufficiently small gain. Typically, $E_{sc}$ has a frequency that is near the peak of the gain curve so that the gain for the noise electromagnetic fields is approximately the same as for the seed electromagnetic field. Under these conditions, the required injection seeding intensity may be represented by Eq. (2):

$$E_{sc} E^*_{sc} \geq E_n E^*_n \qquad \text{Eq.(2)}$$

In Eq. (2), the noise sources are presumed to experience the same gain as $E_{sc}$.

At least two additional factors may complicate the injection seeding. First, the spectral purity of the output can change with the amount by which $E_{sc} E^*_{sc}$ exceeds $E_n E^*_n$. The noise can steal some of the energy stored in the inverted population and cause masing at unwanted frequencies and phases despite the presence of the dominant seed. This behavior may be due to the fact that injection seeding is not a threshold phenomenon. The amount of unwanted masing can be quantified by the spectral purity, P. The spectral purity is the ratio of the energy in the desired mode to that in the undesired modes, as shown by Eq. (3):

$$P = \frac{G_{sc} E_{sc} E^*_{sc}}{G_{sc} E_{sc} E^*_{sc} + G_n E_n E^*_n} \qquad \text{Eq. (3)}$$

where $G_{sc}$ and $G_n$ are the time integrated gain for the seed and noise, respectively. The expression includes integration over the noise modes. Eq. (3) indicates that the required seed electromagnetic field strength is related to the spectral purity that is necessitated by a particular application. As a consequence, a zeroth order approximation can be interpreted as the condition where $P \geq 0.5$. As the seed power, weighted by the gain, increases relative to the noise power weighted by the gain, the spectral purity of the maser output increases. The second refinement deals with the evolution of pulses which may be important for amplitude modulation. Amplitude modulation, which is used to generate pulses, can be realized by modulating the pump lasers to affect the population inversion. To assure that the pulse carrier wave is centered at the correct frequency and phase, injection seeding can be used, as described, largely unchanged. However, in many situations, the seed electromagnetic field in the maser cavity should be strong enough so that the pulse rises to its peak at the desired frequency and phase before the noise seeded component inside the cavity can extract a significant amount of energy from the gain medium. The criterion for significance is set by the prior equations and what is required for an application. For high purity pulses, the gain weighted seed electromagnetic field has to be much stronger than the gain weighted noise sources.

In some implementations, the output of the photonic crystal maser can be phase and frequency modulated by changing the properties of the seed oscillator. Standard techniques for phase and frequency modulation of radio frequency oscillators may be used. The time that the photonic crystal maser takes to respond and change its phase and frequency follows the general principles described above. The changes can take place on a timescale set by the maser cavity lifetime. In some instances, the timescales are nanoseconds, set by the cavity quality factor, Q, and the speed of light in the medium, which may be reduced by the slow-wave structure engineered into the maser cavity.

Figure 3A:
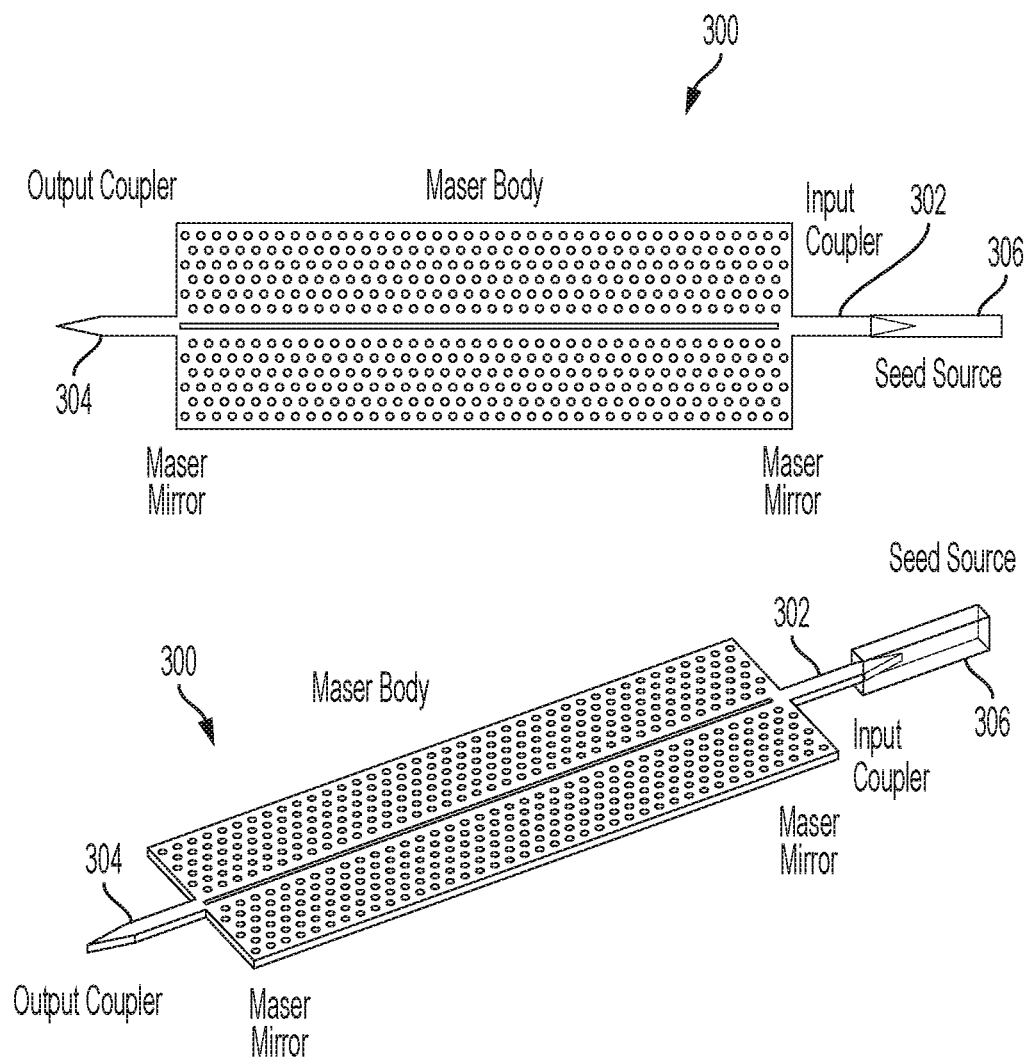
FIG. 3A is a schematic diagram, in top and perspective view, of an example photonic crystal maser that includes an input coupler and an output coupler.

Now referring to FIG. 3A, a schematic diagram is presented, in top and perspective view, of an example photonic crystal maser 300 that includes an input coupler 302 and an output coupler 304. The example photonic crystal maser 300 may be analogous to the photonic crystal maser 200 described in relation to FIGS. 2A and 2B. The maser output passes through the output coupler 304. A second mode matching structure 306 and coupler (e.g., input coupler 302) is placed at the other end of the dielectric body of the photonic crystal maser 300. In the case shown, the input coupler 302 and mode matching structure 306 is designed to efficiently couple in the seed electromagnetic field (or reference RF electromagnetic radiation) from a waveguide.

Figure 3B:
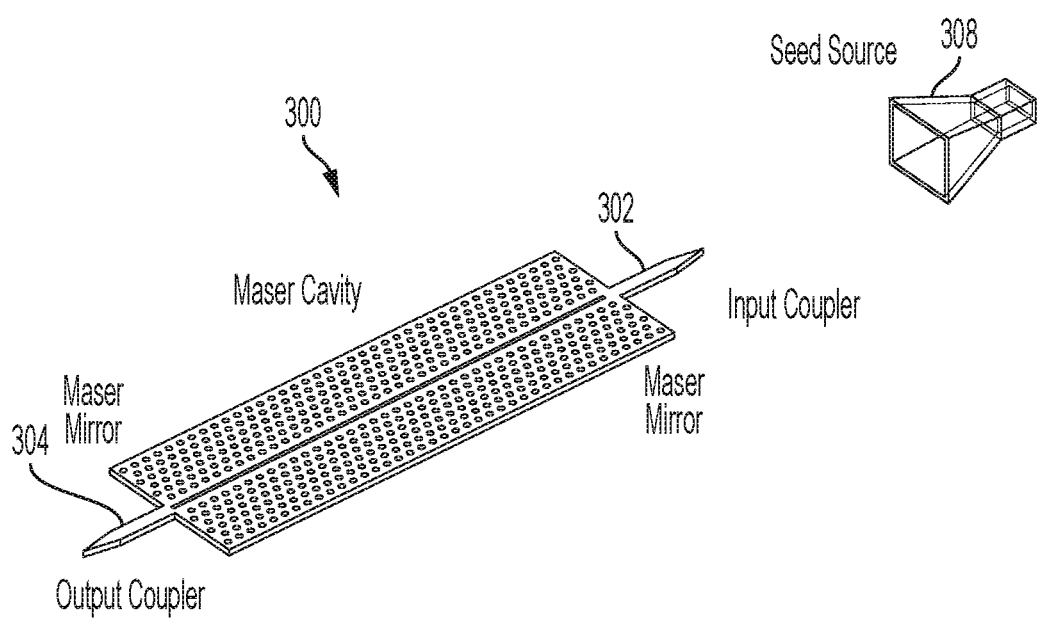
FIG. 3B is a schematic diagram, in perspective view, of the example photonic crystal maser of FIG. 3A, but in which an antenna serves as a reference RF oscillator.

Now referring to FIG. 3B, a schematic diagram is presented, in perspective view, of the example photonic crystal maser 300 of FIG. 3A, but in which an antenna 308 serves as a reference RF oscillator. In the case shown, the input coupler 302 and mode matching structure are designed to efficiently couple in the seed electromagnetic field (or reference RF electromagnetic radiation) from the antenna 308, which is nearby. Compared to FIG. 3A, the configuration shown in FIG. 3B allows the seed source (e.g., the antenna 308) to be stood off from the example photonic crystal maser 300. The example photonic crystal maser 300 is designed to couple to a plane wave or specific antenna gain pattern from the antenna 308.

FIGS. 3A and 3B contrast two different ways to seed the example photonic crystal maser 300. In particular, the example photonic crystal maser 300 can be fed and mode matched to a waveguide (FIG. 3A) or free-space antenna (FIG. 3B) as the seed source. However, other types of reference RF oscillators are possible. For example, maser to maser coupling through free space or through a waveguide is also possible. A conventional RF source can also be coupled to the antenna or waveguide. The reference RF oscillator can be referenced to or include a clock, such as a thermally-stabilized crystal oscillator, a chip scale atomic clock, a GPS signal, or other type of timing reference. The power of the reference RF oscillator can be adjusted until the seeding is sufficient to injection seed the example photonic crystal maser 300. In some instances, the example photonic crystal maser 300 generates nW-μW of output power. In these instances, the injected power from the reference RF oscillator can be on the order of nW, sometimes less. The small amount of seed power and the fact that the seed RF field does not have to be spectrally pure allows a broad range of economical sources to be used to seed the example photonic crystal maser 300. The timing reference can generate a specific starting point for a DSP wave that can be used for the seed. An analog seed can be generated in a similar manner.

In some implementations, the photonic crystal masers described herein may be constructed by creating a photonic crystal frame (or dielectric body) and then bonding one or two optical windows to the frame. These components may be bonded to each other using techniques described in U.S. Pat. No. 10,859,981 entitled "Vapor Cells Having One or More Optical Windows Bonded to a Dielectric Body," and U.S. Pat. No. 11,137,432 entitled "Photonic Crystal Receivers," the disclosures of which, are incorporated herein by reference in their entirety. For example, a contact bonding method may be used to bond the photonic crystal frame to one or both optical windows. Moreover, an adhesion layer may be used to facilitate bonding the photonic crystal frame to one or both optical windows (e.g., an adhesion layer formed of silicon or silicon dioxide).

The photonic crystal frame and optical windows may be formed of dielectric material. For example, the photonic crystal frame may be formed from silicon and the optical windows may be formed from glass (e.g., a borosilicate glass, a fused silica glass, etc.). As another example, the photonic crystal frame, the optical windows, or both may be formed of $BaLn_2Ti_4O_{12}$ (BLT) where Ln corresponds to one or more elements selected from the lanthanide elements. In many variations, the optical windows are transparent to laser light used to pump the maser. This transparency may occur throughout an optical window, or alternatively, be limited to a portion of the optical window, such as a portion covering the elongated slot.

In some implementations, the vapor includes gaseous atoms, molecules, or both. The vapor, or generally emitters, is located in the elongated slot centered in a defect of the photonic crystal (e.g., a linear defect). This location allows the vapor to experience a different electromagnetic mode environment than in free space. In many variations, the mode structure of the electromagnetic field is modified by the presence of the photonic crystal frame. The photonic crystal frame may also be designed to slow an electromagnetic wave by increasing the group velocity index of refraction at and around a specific design frequency. Slowing the electromagnetic wave may increase the stimulated emission rate of the emitters into that mode by increasing the energy density in the cavity relative to free-space. The slowed electromagnetic wave may be largely confined to the elongated slot, which may further intensify the electromagnetic field (e.g., by modifying the resonant mode).

One advantage of this configuration is that the slowing and concentration of the electromagnetic field can lower the masing threshold by increasing the emission rate into the resonant mode. Such lowering allows maser action at lower gain since the gain threshold is lowered. The local field modes at the resonant frequency may be designed to correspond to a specific transition frequency of the vapor residing in the elongated slot. In some instances, color centers or other materials may be placed in the elongated slot. The rate of emission into these modes can be significantly increased relative to emission into other electromagnetic field modes, for example, modes corresponding to directions orthogonal to the elongated slot or other frequencies.

In some instances, a maser is initiated by creating an inversion on a high lying transition of the emitters placed inside the elongated slot, such as by laser excitation of a high lying Rydberg state. For example, a pump laser(s) can be coupled into the elongated slot using mirrors and fiber optics. Spontaneous emission into the slot-photonic crystal mode triggers an avalanche of stimulated emission into this mode, creating a maser. The masing process may produce a coherent, directed source of electromagnetic waves at the design frequency. The ends of the elongated slot and photonic crystal frame can be constructed as mirrors for the maser by changing the geometry of the photonic crystal. Moreover, multiple passes of the wave through the elongated slot can be designed into the structure allowing for greater amplification of the electromagnetic wave. In some variations, a taper located adjacent to the output mirror can be used to couple the output electromagnetic wave to free space and shape the output beam. Other structures for shaping the beam at the output are possible, such as a lens. The device may be amplitude modulated by modulating the pumping (e.g., modulating an intensity of the laser light).

In some implementations, low temperature contact bonding is used for vacuum sealing, such as described in U.S. Pat. No. 10,859,981 and U.S. Pat. No. 11,137,432. One of the optical windows—or a fill hole in one of the optical windows—can be contact bonded so that the atomic sample remains pure. Other methods of bonding may require high temperatures and/or voltages be applied to the vapor cell leading to significant outgassing, which can compromise the performance of the maser due to collisions. In certain cases, a small stem may be used for filling the vapor cell. In these cases, the optical windows can be anodically bonded to the frame. The structure is made of all-dielectric materials.

In some implementations, the photonic crystal masers may produce coherent radiation in the radio frequency (RF) regime (e.g., 100 MHz-1 THz), and as such, may function similar to a laser emitting radio-frequency (RF) electromagnetic radiation. In some variations, the regime ranges from 20 kHz to 1 THz. In further variations, the regime ranges from 20 kHz to 300 GHz. The photonic crystal maser may include a monolithic photonic crystal frame, with a vapor cell incorporated therein, to construct a maser that can produce powers up to about 100 nW. Although the power is low, the device may be fabricated from dielectric materials and can be used to produce directed RF signals for over-the-air testing and communications. The emitted beam can be directional and coherent, allowing propagation for long distances without the spatial spread commonly produced by antennas. Such spatial spread leads to a $R^{-2}$ reduction in the beam intensity, where R is the propagation distance. The dielectric construction of the photonic crystal maser allows it to sit in an anechoic chamber and produce modulated RF signals for testing without significantly perturbing the environment. Photonic crystal masers can also be used for timing and frequency referencing, RF spectroscopy, or as a local oscillator in conjunction with a Rydberg atom-based receiver or other type of conventional receiver.

In some examples, a photonic crystal maser includes the photonic crystal structure (or frame) and a fiber optic circuit to channel pump laser light into an elongated slot of the photonic crystal structure. The photonic crystal maser may also include one or more pump lasers and electronics to control these lasers. The electronics may also control an output coupler, or other structure, to shape (e.g., collimate) the output beam from the pump laser and impedance match the output beam to a propagation medium.

In some aspects of what is described, a photonic crystal maser may be described by the following examples:

Example 1. A photonic crystal maser comprising:
   a dielectric body comprising:
      an array of cavities ordered periodically to define a photonic crystal structure in the dielectric body,
      a region in the array of cavities defining a defect in the photonic crystal structure,
      an elongated slot through the region extending from a slot opening in a surface of the dielectric body at least partially through the dielectric body, the elongated slot and the array of cavities defining a waveguide of the dielectric body; and
      an input coupler aligned with an end of the elongated slot and configured to couple a reference radiofrequency (RF) electromagnetic radiation to the waveguide, the reference RF electromagnetic radiation having one or both of a controlled frequency and a controlled phase;
   an optical window covering the elongated slot and having a window surface bonded to the surface of the dielectric body to form a seal about the slot opening;
   a vapor or a source of the vapor in the elongated slot, the vapor comprising:
      one or more input electronic transitions; and
      an output electronic transition coupled to the one or more input electronic transitions and operable to emit a target RF electromagnetic radiation, the output electronic transition resonant with a waveguide mode of the waveguide.

Example 2. The photonic crystal maser of example 1 wherein the reference RF electromagnetic radiation is resonant with the waveguide mode of the waveguide.

Example 3. The photonic crystal maser of example 1 or example 2, wherein the input coupler extends from a side of the dielectric body and terminates in a tapered end.

Example 4. The photonic crystal maser of example 1 or any one of examples 2-3, comprising a reference RF oscillator configured to produce the reference RF electromagnetic radiation, the reference RF oscillator electromagnetically coupled to the input coupler of the dielectric body.

Example 5. The photonic crystal maser of example 1 or any one of examples 2-4, comprising a laser configured to generate an optical signal capable of exciting the one or more input electronic transitions of the vapor.

Example 6. The photonic crystal maser of example 1 or any one of example 2-5, wherein the photonic crystal structure is configured to concentrate the target RF electromagnetic radiation in the elongated slot.

Example 7. The photonic crystal maser of example 1 or any one of example 2-6,
   wherein the region in the array of cavities extends along an axis and the elongated slot is aligned parallel to the axis; and
   wherein the photonic crystal structure is configured to decrease a group velocity of the target RF electromagnetic radiation along a direction parallel to the axis.

Example 8. The photonic crystal maser of example 1 or any one of examples 2-7, wherein the array of cavities comprises one or more offset cavities that are spatially offset from an ideal periodic position in the array.

Example 9. The photonic crystal maser of example 1 or any one of examples 2-8, comprising an optical mirror disposed at an end of the elongated slot.

Example 10. The photonic crystal maser of example 1 or any one of examples 2-9, wherein the dielectric body comprises an output coupler aligned with a second end of the elongated slot and configured to impedance match the target RF electromagnetic radiation to an ambient environment of the photonic crystal maser.

Example 11. The photonic crystal maser of example 10, wherein the output coupler extends from a side of the dielectric body and terminates in a tapered end.

Example 12. The photonic crystal maser of example 1 or any one of examples 2-11, wherein the photonic crystal structure defines a photonic band gap associated with a transverse magnetic (TM) mode of the target RF electromagnetic radiation in the waveguide.

Example 13. The photonic crystal maser of example 1 or any one of examples 2-12, wherein the photonic crystal structure defines a photonic band gap associated with a transverse electric (TE) mode of the target RF electromagnetic radiation in the waveguide.

Example 14. The photonic crystal maser of example 1 or any one of examples 2-13, wherein the vapor comprises a gas of alkali-metal atoms.

Example 15. The photonic crystal maser of example 1 or any one of examples 2-14,
wherein the region forms a loop in the array of cavities and the elongated slot extends along a loop axis of the loop to form a looped slot; and
wherein the vapor or the source of the vapor is disposed in at least a portion of the looped slot.

Example 16. The photonic crystal maser of example 15,
wherein the looped slot is associated with first and second loop directions along the loop axis, the first loop direction opposite the second loop direction;
wherein the looped slot comprises first and second RF ports; and
wherein the photonic crystal maser comprises:
first and second directional couplers coupled to, respectively, the first and second RF ports, the first directional coupler configured to receive a first portion of the target RF electromagnetic radiation traveling along the first loop direction, the second directional coupler configured to receive a second portion of the target RF electromagnetic radiation traveling along the second loop direction.

In some aspects of what is described, a method for generating radiofrequency (RF) electromagnetic radiation may be described by the following examples:

Example 17. A method for generating radiofrequency (RF) electromagnetic radiation, the method comprising:
receiving a reference RF electromagnetic radiation at an input coupler of a dielectric body, the dielectric body part of a photonic crystal maser and comprising:
an array of cavities ordered periodically to define a photonic crystal structure in the dielectric body,
a region in the array of cavities defining a defect in the photonic crystal structure,
an elongated slot through the region extending from a slot opening in a surface of the dielectric body at least partially through the dielectric body, the elongated slot and the array of cavities defining a waveguide of the dielectric body, and
the input coupler, aligned with an end of the elongated slot and configured to couple the reference RF electromagnetic radiation to the waveguide,
wherein the photonic crystal maser comprises:
an optical window covering the elongated slot of the dielectric body and having a window surface bonded to a surface of the dielectric body to form a seal about the slot opening, and
a vapor sealed in the elongated slot of the dielectric body and comprising:
one or more input electronic transitions excitable by an optical signal, and
an output electronic transition coupled to the one or more input electronic transitions and operable to emit a target RF electromagnetic radiation, the output electronic transition resonant with a waveguide mode of the waveguide;
receiving the optical signal into the elongated slot of a dielectric body; and
emitting the target RF electromagnetic radiation from the vapor in response to receiving the optical signal, the target RF electromagnetic radiation based on the reference RF electromagnetic radiation.

Example 18. The method of example 17, wherein receiving the reference RF electromagnetic radiation comprises coupling, by operation of the input coupler, the reference RF electromagnetic radiation to the waveguide of the dielectric body.

Example 19. The method of example 17 or example 18, wherein the target RF electromagnetic radiation has one or both of a frequency and a phase set by, respectively, one or both of a frequency and a phase of the reference RF electromagnetic radiation.

Example 20. The method of example 17 or any one of examples 18-19, wherein the reference RF electromagnetic radiation is resonant with the waveguide mode of the waveguide.

Example 21. The method of example 17 or any one of examples 18-20, comprising:
generating the reference RF electromagnetic radiation by operation of a reference RF oscillator.

Example 22. The method of example 21, wherein generating the reference RF electromagnetic radiation comprises controlling one or both of a frequency and a phase of the reference RF electromagnetic radiation.

Example 23. The method of example 17 or any one of examples 18-22, comprising:
amplifying the target RF electromagnetic radiation by resonating at least a portion of the target RF electromagnetic radiation between the output electronic transition and the waveguide mode.

Example 24. The method of example 23, wherein amplifying the target RF electromagnetic radiation comprises concentrating the target RF electromagnetic radiation in the elongated slot.

Example 25. The method of example 23 or example 24,
wherein the region in the array of cavities extends along an axis and the elongated slot is aligned parallel to the axis; and
wherein amplifying the target RF electromagnetic radiation comprises decreasing a group velocity of the target RF electromagnetic radiation along a direction parallel to the axis.

Example 26. The method of example 23 or any one of examples 24-25,
wherein the array of cavities comprises one or more offset cavities that are spatially offset from an ideal periodic position in the array; and
wherein amplifying the target RF electromagnetic radiation comprises reflecting the target RF electromagnetic radiation off the offset cavities.

Example 27. The method of example 17 or any one of examples 18-26, wherein receiving the optical signal into the elongated slot comprises interacting the optical signal with the vapor in the elongated slot.

Example 28. The method of example 17 or any one of examples 18-27, wherein receiving the optical signal into the elongated slot comprises reflecting the optical signal off a mirror disposed at an end of the elongated slot.

Example 29. The method of example 17 or any one of examples 18-28, comprising:
directing, by operation of the waveguide, the target RF electromagnetic radiation toward an end of the dielectric body.

Example 30. The method of example 17 or any one of examples 18-29,
wherein the dielectric body comprises an output coupler aligned with a second end of the elongated slot and configured to impedance match the target RF electromagnetic radiation to an ambient environment of the photonic crystal maser; and wherein the method comprises:

coupling the target RF electromagnetic radiation after emission or amplification to the output coupler; and by operation of the output coupler, impedance matching the coupled target RF electromagnetic radiation to an ambient environment of the dielectric body.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A photonic crystal maser comprising:
   a dielectric body comprising:
      an array of cavities ordered periodically to define a photonic crystal structure in the dielectric body,
      a region in the array of cavities defining a defect in the photonic crystal structure,
      an elongated slot through the region extending from a slot opening in a surface of the dielectric body at least partially through the dielectric body, the elongated slot and the array of cavities defining a waveguide of the dielectric body; and
      an input coupler aligned with an end of the elongated slot and configured to couple a reference radiofrequency (RF) electromagnetic radiation to the waveguide, the reference RF electromagnetic radiation having one or both of a controlled frequency and a controlled phase;
   an optical window covering the elongated slot and having a window surface bonded to the surface of the dielectric body to form a seal about the slot opening;
   a vapor or a source of the vapor in the elongated slot, the vapor comprising:
      one or more input electronic transitions; and
      an output electronic transition coupled to the one or more input electronic transitions and operable to emit a target RF electromagnetic radiation, the output electronic transition resonant with a waveguide mode of the waveguide.

2. The photonic crystal maser of claim 1, wherein the reference RF electromagnetic radiation is resonant with the waveguide mode of the waveguide.

3. The photonic crystal maser of claim 1, wherein the input coupler extends from a side of the dielectric body and terminates in a tapered end.

4. The photonic crystal maser of claim 1, comprising a reference RF oscillator configured to produce the reference RF electromagnetic radiation, the reference RF oscillator electromagnetically coupled to the input coupler of the dielectric body.

5. The photonic crystal maser of claim 1, comprising a laser configured to generate an optical signal capable of exciting the one or more input electronic transitions of the vapor.

6. The photonic crystal maser of claim 1, wherein the photonic crystal structure is configured to concentrate the target RF electromagnetic radiation in the elongated slot.

7. The photonic crystal maser of claim 1,
   wherein the region in the array of cavities extends along an axis and the elongated slot is aligned parallel to the axis; and
   wherein the photonic crystal structure is configured to decrease a group velocity of the target RF electromagnetic radiation along a direction parallel to the axis.

8. The photonic crystal maser of claim 1, wherein the array of cavities comprises one or more offset cavities that are spatially offset from an ideal periodic position in the array.

9. The photonic crystal maser of claim 1, comprising an optical mirror disposed at an end of the elongated slot.

10. The photonic crystal maser of claim 1, wherein the dielectric body comprises an output coupler aligned with a second end of the elongated slot and configured to impedance match the target RF electromagnetic radiation to an ambient environment of the photonic crystal maser.

11. The photonic crystal maser of claim 10, wherein the output coupler extends from a side of the dielectric body and terminates in a tapered end.

12. The photonic crystal maser of claim 1, wherein the photonic crystal structure defines a photonic band gap associated with a transverse magnetic (TM) mode of the target RF electromagnetic radiation in the waveguide.

13. The photonic crystal maser of claim 1, wherein the photonic crystal structure defines a photonic band gap associated with a transverse electric (TE) mode of the target RF electromagnetic radiation in the waveguide.

14. The photonic crystal maser of claim 1, wherein the vapor comprises a gas of alkali-metal atoms.

15. The photonic crystal maser of claim 1,
   wherein the region forms a loop in the array of cavities and the elongated slot extends along a loop axis of the loop to form a looped slot; and
   wherein the vapor or the source of the vapor is disposed in at least a portion of the looped slot.

16. The photonic crystal maser of claim 15,
   wherein the looped slot is associated with first and second loop directions along the loop axis, the first loop direction opposite the second loop direction;
   wherein the looped slot comprises first and second RF ports; and
   wherein the photonic crystal maser comprises:
      first and second directional couplers coupled to, respectively, the first and second RF ports, the first directional coupler configured to receive a first portion of the target RF electromagnetic radiation traveling along the first loop direction, the second directional coupler configured to receive a second portion of the target RF electromagnetic radiation traveling along the second loop direction.

17. A method for generating radiofrequency (RF) electromagnetic radiation, the method comprising:
  receiving a reference RF electromagnetic radiation at an input coupler of a dielectric body, the dielectric body part of a photonic crystal maser and comprising:
    an array of cavities ordered periodically to define a photonic crystal structure in the dielectric body,
    a region in the array of cavities defining a defect in the photonic crystal structure,
    an elongated slot through the region extending from a slot opening in a surface of the dielectric body at least partially through the dielectric body, the elongated slot and the array of cavities defining a waveguide of the dielectric body, and
    the input coupler, aligned with an end of the elongated slot and configured to couple the reference RF electromagnetic radiation to the waveguide,
  wherein the photonic crystal maser comprises:
    an optical window covering the elongated slot of the dielectric body and having a window surface bonded to a surface of the dielectric body to form a seal about the slot opening, and
    a vapor sealed in the elongated slot of the dielectric body and comprising:
      one or more input electronic transitions excitable by an optical signal, and an output electronic transition coupled to the one or more input electronic transitions and operable to emit a target RF electromagnetic radiation, the output electronic transition resonant with a waveguide mode of the waveguide;
  receiving the optical signal into the elongated slot of a dielectric body; and
  emitting the target RF electromagnetic radiation from the vapor in response to receiving the optical signal, the target RF electromagnetic radiation based on the reference RF electromagnetic radiation.

18. The method of claim 17, wherein receiving the reference RF electromagnetic radiation comprises coupling, by operation of the input coupler, the reference RF electromagnetic radiation to the waveguide of the dielectric body.

19. The method of claim 17, wherein the target RF electromagnetic radiation has one or both of a frequency and a phase set by, respectively, one or both of a frequency and a phase of the reference RF electromagnetic radiation.

20. The method of claim 17, wherein the reference RF electromagnetic radiation is resonant with the waveguide mode of the waveguide.

21. The method of claim 17, comprising:
  generating the reference RF electromagnetic radiation by operation of a reference RF oscillator.

22. The method of claim 21, wherein generating the reference RF electromagnetic radiation comprises controlling one or both of a frequency and a phase of the reference RF electromagnetic radiation.

23. The method of claim 17, comprising:
  amplifying the target RF electromagnetic radiation by resonating at least a portion of the target RF electromagnetic radiation between the output electronic transition and the waveguide mode.

24. The method of claim 23, wherein amplifying the target RF electromagnetic radiation comprises concentrating the target RF electromagnetic radiation in the elongated slot.

25. The method of claim 23,
  wherein the region in the array of cavities extends along an axis and the elongated slot is aligned parallel to the axis; and
  wherein amplifying the target RF electromagnetic radiation comprises decreasing a group velocity of the target RF electromagnetic radiation along a direction parallel to the axis.

26. The method of claim 23,
  wherein the array of cavities comprises one or more offset cavities that are spatially offset from an ideal periodic position in the array; and
  wherein amplifying the target RF electromagnetic radiation comprises reflecting the target RF electromagnetic radiation off the offset cavities.

27. The method of claim 17, wherein receiving the optical signal into the elongated slot comprises interacting the optical signal with the vapor in the elongated slot.

28. The method of claim 17, wherein receiving the optical signal into the elongated slot comprises reflecting the optical signal off a mirror disposed at an end of the elongated slot.

29. The method of claim 17, comprising:
  directing, by operation of the waveguide, the target RF electromagnetic radiation toward an end of the dielectric body.

30. The method of claim 17,
  wherein the dielectric body comprises an output coupler aligned with a second end of the elongated slot and configured to impedance match the target RF electromagnetic radiation to an ambient environment of the photonic crystal maser; and
  wherein the method comprises:
    coupling the target RF electromagnetic radiation after emission or amplification to the output coupler; and
    by operation of the output coupler, impedance matching the coupled target RF electromagnetic radiation to an ambient environment of the dielectric body.

* * * * *

UNITED STATES PATENT AND TRADEMARK OFFICE
CERTIFICATE OF CORRECTION

| | | |
|---|---|---|
| PATENT NO. | : 11,469,566 B1 | Page 1 of 1 |
| APPLICATION NO. | : 17/667296 | |
| DATED | : October 11, 2022 | |
| INVENTOR(S) | : Amarloo et al. | |

It is certified that error appears in the above-identified patent and that said Letters Patent is hereby corrected as shown below:

On the Title Page

Page 3, Column 1, Line 5, item [56] Other Publications, delete "Ribidium" and insert -- Rubidium -- therefor.

In the Specification

Column 6, Line 30, delete "200" and insert -- 210 -- therefor.

Column 7, Line 16, delete "ρ>10³π•cm," and insert -- $\rho > 10^3 \Omega\cdot\text{cm}$ -- therefor.

Column 7, Line 26, delete "Al₂O₃)," and insert -- $Al_2O_3$), -- therefor.

Column 10, Line 26, delete "214" and insert -- 250 -- therefor.

Column 10, Line 46, delete "212" and insert -- 214 -- therefor.

In the Claims

Column 23, Claim 17, Line 26, after "and" insert -- ¶ --.

Signed and Sealed this
Seventeenth Day of January, 2023

*Katherine Kelly Vidal*

Katherine Kelly Vidal
*Director of the United States Patent and Trademark Office*